(12) United States Patent
Mitsutani (10) Patent No.: US 6,789,226 B2
(45) Date of Patent: Sep. 7, 2004

(54) DECODER AND METHOD OF DECODING BLOCK CODES

(75) Inventor: Naoki Mitsutani, Tokyo (JP)

(73) Assignee: NEC Corporation, Tokyo (JP)

( * ) Notice: Subject to any disclaimer, the term of this patent is extended or adjusted under 35 U.S.C. 154(b) by 477 days.

(21) Appl. No.: 09/876,180

(22) Filed: Jun. 8, 2001

(65) Prior Publication Data

US 2002/0029366 A1 Mar. 7, 2002

(30) Foreign Application Priority Data

Jun. 8, 2000 (JP) ........................................ 2000-172176

(51) Int. Cl.[7] ............................................. H03M 13/00
(52) U.S. Cl. ........................ 714/784; 714/782; 714/780; 714/774
(58) Field of Search ................................ 714/781, 782, 714/784, 780, 774

(56) References Cited

U.S. PATENT DOCUMENTS

| | | | | |
|---|---|---|---|---|
| 5,148,385 A | * | 9/1992 | Frazier ........................ | 708/426 |
| 5,548,684 A | * | 8/1996 | Wang et al. ................... | 706/16 |
| 5,717,825 A | * | 2/1998 | Lamblin ....................... | 704/223 |
| 5,764,858 A | | 6/1998 | Sheu et al. .................... | 395/22 |
| 6,052,349 A | | 4/2000 | Okamoto | |
| 6,335,913 B1 | | 1/2002 | Okamoto | |
| 6,578,172 B1 | * | 6/2003 | Hamalainen et al. ........ | 714/786 |

FOREIGN PATENT DOCUMENTS

| | | |
|---|---|---|
| EP | 0 967 731 | 12/1999 |
| JP | 8943992 | 2/1989 |
| JP | 1-240032 | 9/1989 |
| JP | 6-276106 | 9/1994 |
| JP | 96259866 | 9/1996 |
| JP | 97242453 | 9/1997 |
| JP | 9-306102 | 11/1997 |
| JP | 10-013251 | 1/1998 |
| JP | 9871688 | 3/1998 |
| JP | 10-229342 | 8/1998 |
| JP | 10-256919 | 9/1998 |
| JP | 11-126096 | 5/1999 |
| WO | WO 95/05640 | 2/1995 |

OTHER PUBLICATIONS

Teich et al., "A Novel Decoder Structure for Convolutional Codes Based on a Multilayer Perceptron," vol. 1, Nov. 1995, pp. 449–454, IEEE International Conference on Neural Networks, New York.

Ortuno et al., "Error Correcting Neural Networks for Channels with Gaussian Noise," vol. 4, 1992, pp. 295–300, IEEE Proceedings of the International Joint Conference on Neural Networks, New York.

Ortuno et al., "Neural Networks as Error Correcting Systems in Digital Communications," Springer–Verlag, Sep. 17, 1991; pp. 409–414.

* cited by examiner

*Primary Examiner*—Albert Decady
*Assistant Examiner*—Joseph D. Torres
(74) *Attorney, Agent, or Firm*—Foley & Lardner LLP (57) ABSTRACT

A decoder for decoding an encoded word X having N bits as an encoded signal that was encoded by an encoder from an ex-code word Y having M bits as a signal before being encoded by the encoder, includes (a) a correlation matrix computation part which makes computation of the encoded word X with a correlation matrix W defined by N rows and M columns, to output a computation result having 1 row and M columns and thereby M components, (b) a judgment part which judges each component in the computation result, and (c) an ex-code word output part which outputs a result of judgment carried out in the judgment part, as a recovered ex-code word corresponding to the ex-code word Y.

18 Claims, 7 Drawing Sheets

DECODER AND METHOD OF DECODING BLOCK CODES

BACKGROUND OF THE INVENTION

1. Field of the Invention

The present invention relates to a decoder and a decoding method, and more particularly to a decoder and a decoding method both of which decode a block code as an error correction code.

2. Description of the Related Art

A conventional method for decoding a block code as an error correction code is generally comprised of steps of calculating a syndrome from a received coded word, acquiring an erroneous position polynomial from the syndrome, and acquiring an erroneous position of the received coded word by solving the erroneous position polynomial, thereby carrying out an error correction.

For instance, Japanese Unexamined Patent Publications Nos. 10-229342 and 6-276106 suggest a method of correcting an error generated in a transmission path by reversing a bit located in an erroneous position, if such an erroneous position can be found.

As an alternative, as suggested in Japanese Unexamined Patent Publications Nos. 10-256919 and 10-13251, an erroneous position may be identified by defining a conversion table from a syndrome, instead of solving the erroneous position polynomial.

Japanese Unexamined Patent Publication No. 1-240032 has suggested a system of encoding a KL conversion coefficient obtained by KL-converting a vectorial input signal, including first means of determining an auto-correlation coefficient of the input signal, a matrix code book used for KL conversion and defined by inherent vectors of an auto-correlation matrix which is predetermined based on training input signals, an inherent value table associated with the code book, an auto-correlation coefficient table and a table for optimally distributing bits, second means for calculating deformation of a representative vector, based on the auto-correlation coefficient, a representative vector of the matrix code book, the inherent value table, and the auto-correlation coefficient table, retrieving an optimal representative vector to minimize the deformation, third means for conducting KL conversion to the input signal in accordance with the optimal representative vector, fourth means for encoding a conversion coefficient obtained by conversion conducted by the third means, and fifth means for encoding the number of the optimal representative vector.

Japanese Unexamined Patent Publication No. 9-306102 has suggested a digital signal decoder including an equalizer for equalizing a reproduced signal obtained by digitizing an input analog signal indicative of encoded binary data, in accordance with a partial response process, and a decoder which decodes the thus equalized reproduced signal. The equalizer is comprised of an input layer, an output layer, and at least one intermediate layer sandwiched between the input and output layers, and it performs non-linear equalization. The intermediate layer is comprised of a plurality of calculators. At least a part of parameters to be determined for at least one of the input layer, the output layer and the intermediate layer is set at a fixed value.

Japanese Unexamined Patent Publication No. 11-126096 has suggested a voice encoding and decoding apparatus including (a) a filter having a filter coefficient obtained by analyzing and quantizing an adaptive vector indicative of a pitch, a noise vector indicative of noises, and input voice signals, and (b) a distortion calculator which calculates distortion in both the input voice signal and a synthesized voice signal obtained by driving the filter, and identifies one adaptive vector and one noise vector which minimize the distortion. The distortion calculator is designed to have functions of (a) defining a matrix N by calculating both power of a signal generated by synthesizing the adaptive vectors in the filter, and an auto-correlation matrix of a filter coefficient of the filter, and multiplying each components of the auto-correlation matrix with the power, (b) defining a matrix M by synthesizing signals generated by synthesizing the adaptive vectors in the filter, in time inverse order, and calculating an outer product of the thus synthesized signals, (c) subtracting the matrix M from the matrix N to define a matrix L, and (d) calculating the distortion based on the matrix L.

However, the above-mentioned conventional methods are accompanied with a problem that since a syndrome or a solution of an erroneous position polynomial cannot be instantaneously calculated from a received coded word, it is necessary to delay the received coded word by a time necessary for calculating the erroneous position, and as a result, a delay occurs in decoding a block code.

Furthermore, in accordance with the above-mentioned conventional method for acquiring an erroneous position through the use of a conversion table made from a syndrome, it is not necessary to solve an erroneous position polynomial, but instead it is necessary to prepare the conversion table in correspondence to all of the received coded words. For instance, since a Reed-Solomon code in ETSI standards has a coding ratio (204, 188), a potential number of different received coded words is (8×204)-th power of 2 ($2^{8 \times 204}$). Thus, the conventional method is accompanied with a problem that the conversion table to be made by hardware/software is unrealizable.

SUMMARY OF THE INVENTION

In view of the above-mentioned problems in the conventional methods, it is an object of the present invention to provide a decoder and a decoding method both of which are capable of obtaining an ex-coded word without calculating a syndrome and solving an erroneous position polynomial, and minimizing a decoding delay.

Furthermore, it is another object of the present invention to provide an apparatus for learning a correlation matrix and a method of doing the same, both of which are capable of providing a correlation matrix which can be applied to any polynomial for encoding a word, in order to have a correlation matrix by learning block-encoded words and ex-code words.

In one aspect of the present invention, a decoder for decoding an encoded word X having N bits as an encoded signal which was encoded by an encoder from an ex-code word Y having M bits as a signal before being encoded by the encoder, includes (a) a correlation matrix computation part which makes computation of the encoded word X with a correlation matrix W defined by N rows and M columns, to output a computation result having 1 row and M columns, (b) a judgment part which judges each component in the computation result, and (c) an ex-code word output part which outputs a result of judgment carried out the judgment part, as a recovered ex-code word corresponding to the ex-code word Y.

It is preferable that the correlation matrix computation part computes a product of the encoded word X and the correlation matrix W.

It is preferable that the correlation matrix computation part is comprised of (a1) a memory which stores the correlation matrix W therein, and (a2) a calculator which calculates a product of the encoded word X and the correlation matrix W.

It is preferable that the judgment part transmits a signal of "1" if the respective component of the computation result is positive or zero, and transmits a signal of "0" if the respective component of the computation result is negative.

It is preferable that the correlation matrix W is defined such that the respective component of the computation result is equal to or greater than a predetermined positive threshold if a corresponding component of the ex-code word Y is 1, and the respective component of the computation result is equal to or smaller than a predetermined negative threshold if a corresponding component of the ex-code word Y is 0.

For instance, the encoded word X may be comprised of symbols. For instance, the encoded word X is comprised of Reed-Solomon codes.

In another aspect of the present invention, there is provided an apparatus for determining a correlation matrix W used in the decoder defined in claim 1, including (a) a correlation matrix calculation part which makes calculation of the encoded word X with the correlation matrix W to output calculation result, and (b) a device which compares the calculation result to a threshold ±TH determined in accordance with "1" or "1" as components of the ex-code word Y for each component of the calculation result, and updates the correlation matrix W based on a result of comparison.

It is preferable that the device updates each component of the correlation matrix W such that each component of the calculation result is equal to or greater than a predetermined positive threshold, if the ex-code word Y has a corresponding component of 1, and each component of the calculation result is equal to or smaller than a predetermined negative threshold, if the ex-code word Y has a corresponding component of 0.

It is preferable that the device updates each component of the correlation matrix W by ΔW, which is a value smaller than the predetermined positive threshold.

In still another aspect of the present invention, there is provided a method of decoding an encoded word X having N bits as an encoded signal that was encoded by an encoder from an ex-code word Y having M bits as a signal before being encoded by the encoder, including the steps of (a) making computation of the encoded word X with a correlation matrix W defined by N rows and M columns, to output a computation result having 1 row and M columns to thereby have M components, (b) judging each component in the computation result, and (c) outputting a result of judgment carried out in the step (b), as a recovered ex-code word corresponding to the ex-code word Y.

It is preferable that a product of the encoded word X and the correlation matrix W is computed in the step (a).

It is preferable that, in the step (b), a signal of "1" is transmitted if the respective component of the computation result is positive or zero, and a signal of "0" is transmitted if the respective component of the computation result is negative.

It is preferable that the correlation matrix W used in the step (a) is defined such that the respective component of the computation result is equal to or greater than a predetermined positive threshold if a corresponding component of the ex-code word Y is 1, and the respective component of the computation result is equal to or smaller than a predetermined negative threshold if a corresponding component of the ex-code word Y is 0.

There is further provided a method of determining a correlation matrix W used in the method defined in claim 11, including the steps of (a) making calculation of the encoded word X with the correlation matrix W to output a calculation result, (b) comparing the calculation result to the ex-code word Y for each component, and (c) updating the correlation matrix W, based on a result of comparison carried out in the step (b).

It is preferable that each component of the correlation matrix W is updated in the step (c) such that each component of the calculation result is equal to or greater than a predetermined positive threshold if the ex-code word Y has a corresponding component of 1, and each component of the calculation result is equal to or smaller than a predetermined negative threshold if the ex-code word Y has a corresponding component of 0.

It is preferable that each component of the correlation matrix W is updated in the step (c) by ΔW, which is a value smaller than the predetermined positive threshold.

In yet another aspect of the present invention, there is provided a recording medium readable by a computer, storing a program therein for causing a computer to act as the above-mentioned decoder.

There is further provided a recording medium readable by a computer, storing a program therein for causing a computer to act as the above-mentioned apparatus.

There is still further provided a recording medium readable by a computer, storing a program therein for causing a computer to carry out the above-mentioned method of decoding an encoded word X having N bits as an encoded signal to thereby have an ex-code word Y having M bits as a signal before being encoded.

There is yet further provided a recording medium readable by a computer, storing a program therein for causing a computer to carry out the above-mentioned method of determining a correlation matrix W used in the method of decoding an encoded word X having N bits as an encoded signal to thereby have an ex-code word Y having M bits as a signal before being encoded.

There is further provided a decoder for decoding an encoded word X having N bits as an encoded signal which was encoded by an encoder from an ex-code word Y having M bits as a signal before being encoded by the encoder, including (a) a correlation matrix computation part which makes computation of the encoded word X with a correlation matrix W defined by N rows and M columns, to output a computation result having 1 row and M columns to thereby have M components, (b) a judgment part which judges each component in the computation result, (c) an ex-code word output part which outputs a result of judgment carried out by the judgment part, as a recovered ex-code word corresponding to the ex-code word Y, and (d) a device for determining the correlation matrix W, the device including (d1) a correlation matrix calculation part which makes calculation of the encoded word X with the correlation matrix W to output a calculation result, and (d2) a device which compares the calculation result to the ex-code word Y for each component, and updates the correlation matrix W, based on a result of comparison.

There is further provided a method of decoding an encoded word X having N bits as an encoded signal which was encoded by an encoder from an ex-code word Y having M bits as a signal before being encoded by the encoder, including the steps of (a) determining a correlation matrix W, (b) making computation of the encoded word X with the correlation matrix W defined by N rows and M columns, to output a computation result having 1 row and M columns to thereby have M components, (c) judging each component in the computation result, and (d) outputting a result of judgment carried out in the step (b), as a recovered ex-code word corresponding to the ex-code word Y, the step (a) including the steps of (a1) making calculation of the encoded word X with the correlation matrix W to output a calculation result having M components, (a2) comparing the calculation result to the ex-code word Y for each component, and (a3) updating the correlation matrix W, based on a result of comparison carried out in the step (a2).

The advantages obtained by the aforementioned present invention will be described hereinbelow.

In accordance with the present invention, matrix computation of the correlation matrix W and the block-encoded word X is carried out through the use of the correlation matrix W defined by the block-encoded words X and the ex-codes Y without carrying out computation of a syndrome and without having to solve for an erroneous position polynomial, and each bit in the computation result "y" is judged whether it is "1" or "0", thereby the ex-code word Y can be obtained. The embodiment provides an advantage that signal delay is minimized.

In addition, the present invention further provides an advantage that since the correlation matrix W is learnt for updating, based on the block-encoded words X and ex-code words Y, the resulting correlation matrix W can correspond to any polynomial for encoding.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Preferred embodiments in accordance with the present invention will be explained hereinbelow with reference to drawings.

Figure 1:
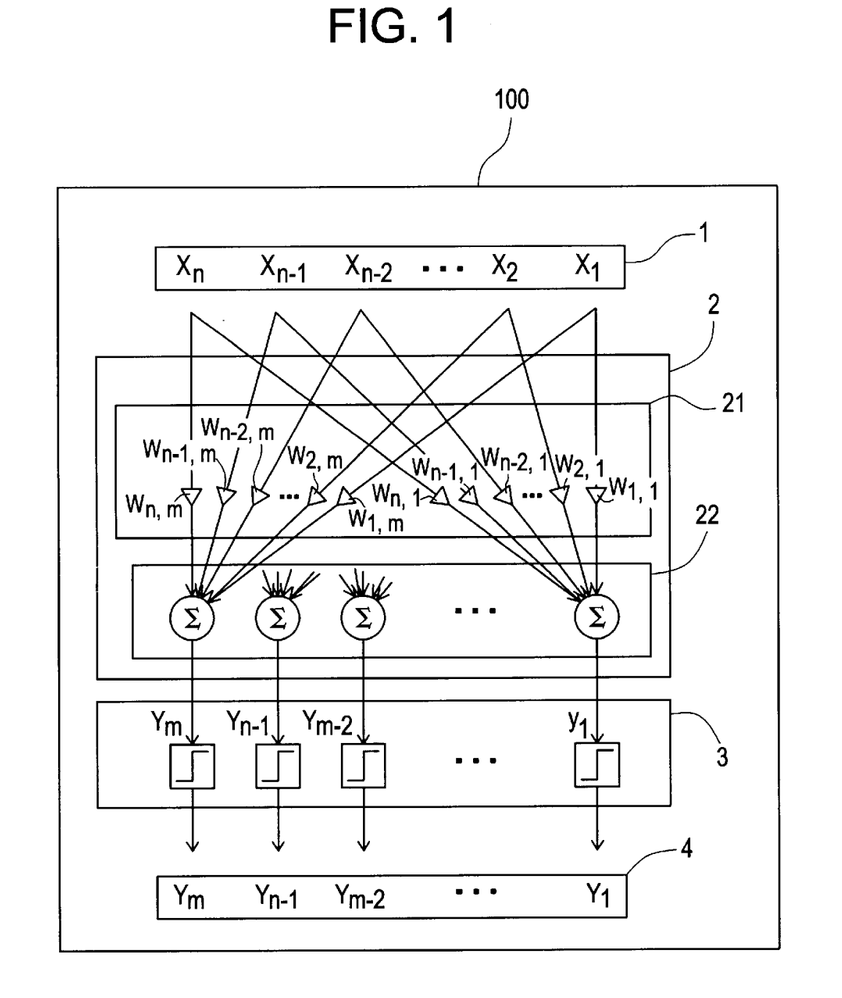
FIG. 1 is a block diagram illustrating a configuration of a decoder in accordance with an embodiment of the present invention.
Figure 2:
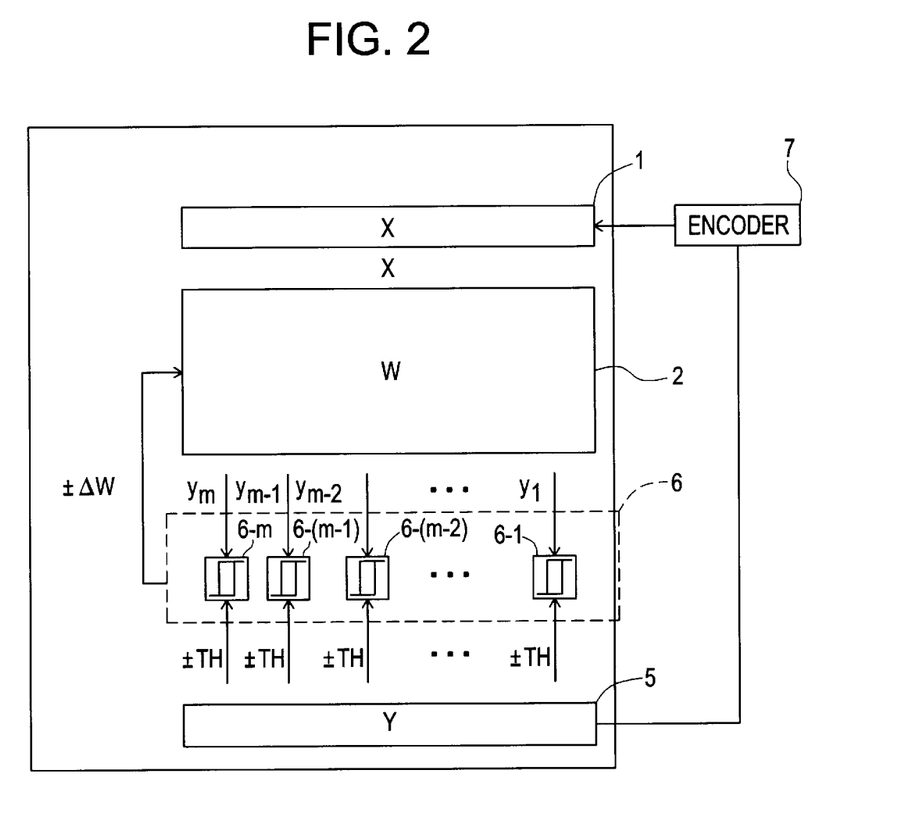
FIG. 2 is a block diagram illustrating a configuration of an apparatus for learning a correlation matrix, in accordance with an embodiment of the present invention.

FIG. 1 is a block diagram illustrating a configuration of a decoder in accordance with an embodiment of the present invention, and FIG. 2 is a block diagram illustrating a configuration of an apparatus for learning a correlation matrix, in accordance with an embodiment of the present invention.

A decoder 100 in accordance with the embodiment is comprised of a coded word input part 1 for inputting an N-bit coded word X which is encoded into a BCH code as a block code having an encoding ratio (N, M), a correlation matrix computation part 2 which computes a product of the coded word X input into the coded word input part 1 and a correlation matrix W defined by N rows and M columns, and outputs a computation result "y" having M columns, a judgment part 3 including M judgment circuits for judging each component of the computation result "y" having 1 row and M columns (and thereby M components), transmitted from the correlation matrix computation part 2, and an ex-code word output part 4 for outputting a result of the judgment carried out by the judgment part 3 as a recovered ex-code word corresponding to the M-bit ex-code word Y.

Herein, an ex-code word indicates a word (e.g., having M bits, M being a positive integer) before being encoded into a code word (e.g., having N bits, N>M).

The correlation matrix computation part 2 is comprised of a correlation matrix storage part 21 for storing the correlation matrix W defined by N rows and M columns, and a correlation matrix calculation part 22 for calculating a product of the coded word X and the correlation matrix W.

An apparatus 200 for learning a correlation matrix, in accordance with the embodiment of the present invention, is comprised of an ex-code word input part 5 for inputting a M-bit ex-code word Y, a coded word input part 1 for inputting a N-bit coded word X which is encoded into a BCH code having an encoding ratio (N, M), a correlation matrix computation part 2 which computes a product of the coded word X input into the coded word input part 1 and a correlation matrix W defined by N rows and M columns, and outputs a computation result "y" having 1 row and M columns, and a comparison part 6 including M comparison circuits 6-1 to 6-m each comparing the computation result "y" to a threshold ±TH determined in accordance with "1" or "1" as components of the ex-code word Y, and updates the correlation matrix W stored in the correlation matrix storage part 21 of the correlation matrix computation part 2, based on the results of comparison conducted by the comparison circuits 6-1 to 6-m.

The M-bit ex-code word Y input into the ex-code word input part 5 is encoded into the N-bit coded word X by an encoder 7, and the N-bit coded word X is input into the coded word input part 1.

Hereinbelow, an operation of the embodiment will be explained in detail with reference to FIGS. 3 to 6.

First, hereinbelow is explained how a coded word is encoded into a BCH code as a block code having an encoding ratio (N, M), with reference to FIGS. 3 and 4.

Figure 3:
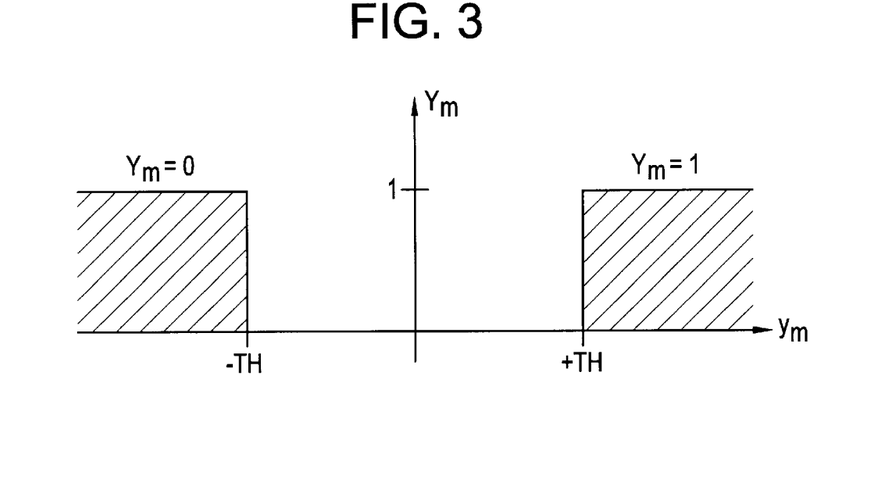
FIG. 3 is a diagram showing the range of input values to be input into a judgement part constituting the decoder illustrated in FIG. 1 in the case of no bit errors in a transmission path.
Figure 4:
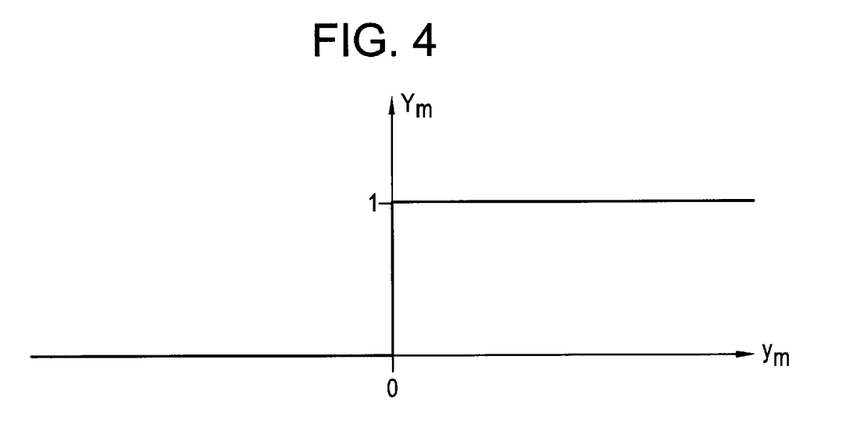
FIG. 4 is a diagram showing a relation between input and output in a judgement part constituting the decoder illustrated in FIG. 1.

FIG. 3 is a diagram showing the range of input values to be input into the judgment part 3 constituting the decoder 100 illustrated in FIG. 1 in the case of no bit errors in a transmission path, and FIG. 4 is a diagram showing a relation between input and output in the judgment part 3.

A N-bit coded word X which was BCH-encoded is input into the coded word input part 1, and then, the correlation matrix computation part 2 computes a product of the coded word X and the correlation matrix W defined by N rows and M columns.

Specifically, the received N-bit coded word X is represented by the following matrix.

$$X = [X_n X_{n-1} X_{n-2} \ldots X_2 X_1].$$

The correlation matrix W defined by N rows and M columns is represented as follows.

$$W = [W_m W_{m-1} W_{m-2} \ldots W_2 W_1]$$

$$W_m = [W_{n,m} W_{n-1,m} W_{n-2,m} \ldots W_{2,m} W_{1,m}]T$$

$$W_{m-1} = [W_{n,m-1} W_{n-1,m-1} W_{n-2,m-1} \ldots W_{2,m-1} W_{1,m-1}]T$$

$$W_{m-2} = [W_{n,m-2} W_{n-1,m-2} W_{n-2,m-2} \ldots W_{2,m-2} W_{1,m-2}]T$$

$$\vdots$$

$$W_2 = [W_{n,2} W_{n-1,2} W_{n-2,2} \ldots W_{2,2} W_{1,2}]T$$

$$W_1 = [W_{n,1} W_{n-1,1} W_{n-2,1} \ldots W_{2,1} W_{1,1}]T$$

Then, a product of the coded word X and the correlation matrix W defined by N rows and M columns is computed.

When the coded word X is represented by "1" and "0", a product is computed with "0" being deemed as "−1".

Herein, the correlation matrix W is a matrix indicating a correlation between the N-bit coded word X which was BCH-encoded and the M-bit ex-code word Y. The correlation matrix W is defined such that when an input value to be input into the judgment part 3 is a value "+TH" or greater, a component or bit of the M-bit ex-code word Y is set to "1", and when an input value to be input into the judgment part 3 is a value "−TH" or smaller, a component or bit of the M-bit ex-code word Y is set to "0".

Herein, since a value of "±TH" indicates a noise margin, a greater "|±TH|" is more preferable.

A product of the N-bit coded word X and the correlation matrix W, in other words, the result "y" of computation carried out by the correlation matrix computation part 2, is represented as follows.

$$y = X \times W$$

$$= [y_m y_{m-1} y_{m-2} \ldots y_2 y_1]$$

$$y_m = [X_n X_{n-1} X_{n-2} \ldots X_2 X_1] \times W_m$$

$$y_{m-1} = [X_n X_{n-1} X_{n-2} \ldots X_2 X_1] \times W_{m-1}$$

$$y_{m-2} = [X_n X_{n-1} X_{n-2} \ldots X_2 X_1] \times W_{m-2}$$

$$\vdots$$

$$y_2 = [X_n X_{n-1} X_{n-2} \ldots X_2 X_1] \times W_2$$

$$y_1 = [X_n X_{n-1} X_{n-2} \ldots X_2 X_1] \times W_1$$

Since the coded word X is comprised of N columns and the correlation matrix W is comprised of N rows and M columns, the computing result "y" is comprised of 1 row and M columns, and each bit of the result "y" is input into the judgment part 3 comprised of M judgment circuits.

The M judgment circuits constituting the judgment part 3 respectively judge each component of the computing result "y" comprised of 1 row and M columns (and thereby having M components). When an input value is "0" or greater, the judgment circuit in the judgment part 3 outputs "1" as a judgment result, and when an input value is less than "0", the judgment part 3 outputs "0" as a judgment result.

The ex-code word output part 4 receives the judgment result from the judgment part 3, and outputs the judgment result as a recovered ex-code word corresponding to the M-bit ex-code word Y, that is, a word before being encoded into the code word X.

Specifically, the recovered ex-code word corresponding to the ex-code word Y to be output from the judgment part 3 based on the computing result "y" transmitted from the correlation matrix computation part 2, is represented as follows.

$$Y = [Y_m Y_{m-1} Y_{m-2} \ldots Y_2 Y_1]$$

$$Y_m = 1 \; (y_m \geq 0) \text{ or } 0 \; (y_m < 0).$$

That is, as shown in FIG. 4, when an input value of "0" or greater is input into the judgment part 3, the judgment circuit constituting the judgment part 3 outputs "1," and when an input value of smaller than "0" is input into the judgment part 3, the judgment circuit outputs "0". An M-bit output transmitted from the judgment part 3 constitutes the recovered ex-code word corresponding to the ex-code word Y.

When no bit errors occur in a transmission path, the judgment part 3 receives an input value which is equal to or greater than "+TH", or equal to or smaller than "−TH" in all bits of the M bits, as shown in FIG. 3. Hence, the judgment part 3 transmits an M-bit code as an ex-code word in dependence on the I/O relation shown in FIG. 4.

On the other hand, when a bit error occurs in a transmission path, the judgment part 3 may not receive an input value which is equal to or greater than "+TH", or equal to or smaller than "−TH". However, since the judgment part 3 judges an output bit, based on whether an input value is equal to or greater than "0", or smaller than "0," as shown in the I/O relation illustrated in FIG. 4, it is possible to obtain the ex-code word correctly.

A method of determining the correlation matrix W will be explained hereinbelow with reference to FIGS. 5A and 5B.

The correlation matrix W is determined in accordance with a predetermined learning rule which has been predetermined based on the result "y" of computation between the coded word X and the correlation matrix W wherein the ex-code word Y acts as a desired signal.

Figure 5A:
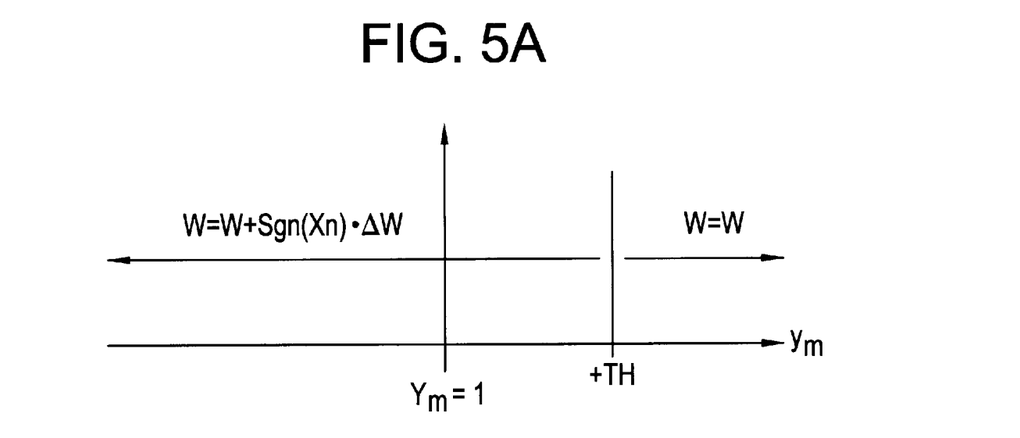
FIG. 5 is a diagram showing a rule for learning a correlation matrix W in a comparison part constituting the apparatus illustrated in FIG. 2.
Figure 5B:
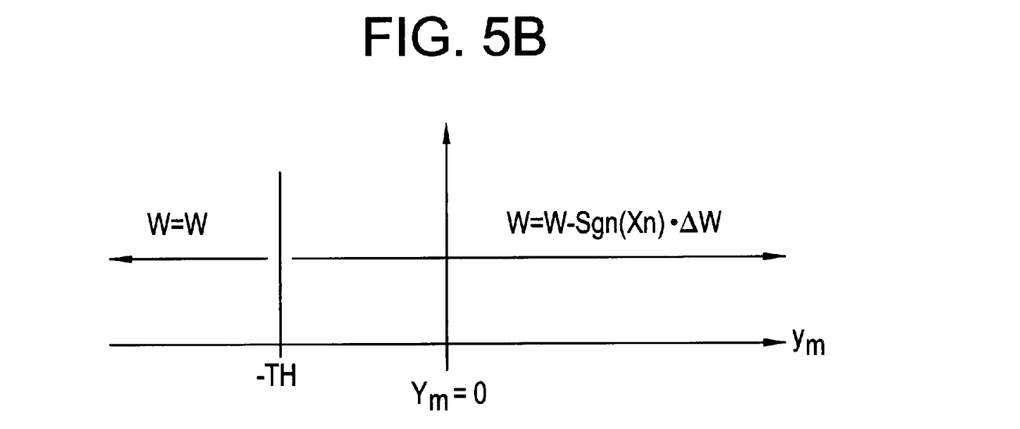

FIGS. 5A and 5B are diagrams showing the learning rule of the correlation matrix W, in accordance with which the comparison part 6 of the apparatus 200 illustrated in FIG. 2 operates.

First, an M-bit ex-code word Y is input into the ex-code word input part 5. The encoder 7 encodes the ex-code word Y input into the ex-code word input part 5, to a BCH code or a block code having an encoding ratio (N, M), and inputs the thus encoded N-bit coded word X into the coded word input part 1.

The correlation matrix computation part 2 computes a product of the coded word X and the correlation matrix W defined by N rows and M columns, and outputs the computation result "y" to the comparison part 6.

The comparison part 6 sets a threshold for each bit of the ex-code word Y having been input into the ex-code word input part 5, and compares the computing result "y" transmitted from the correlation matrix computation part 2, with the thus set threshold.

The comparison part 6 sets "+TH" as a threshold when each bit of the ex-code word Y is "1", and sets "−TH" as a threshold when each bit of the ex-code word Y is "0".

Even when a bit of the ex-code word Y is "1", the correlation matrix W is not updated, if the comparison part 6 receives an input equal to or greater than "+TH". In contrast, if the comparison part 6 receives an input smaller than "+TH", the correlation matrix W is updated only by "±ΔW".

Even when a bit of the ex-code word Y is "0", the correlation matrix W is not updated, if the comparison part 6 receives an input equal to or smaller than "−TH". In contrast, if the comparison part 6 receives an input greater than "−TH", the correlation matrix W is updated only by "±ΔW".

Since the value of "|±ΔW|" is used for gradually updating the correlation matrix W, it is preferable that the value of "|±ΔW|" is sufficiently smaller than "|±TH|".

Specifically, when a bit Ym of the ex-code word Y is "1," a threshold "+TH" is set in the comparison circuit 6-m, and when the comparison circuit 6-m receives an input $y_m$ equal to or greater than "+TH", the correlation matrix W is not updated.

However, when ym is smaller than "+TH", the correlation matrix Wm is updated as follows.

$$W_{n,m} = W_{n,m} + Sgn(X_n) \times \Delta W$$

$$W_{n-1,m} = W_{n-1,m} + Sgn(X_{n-1}) \cdot \times \Delta W$$

$$\vdots$$

$$W_{1,m} = W_{1,m} + Sgn(X_1) \cdot \times \Delta W$$

On the other hand, when a bit Ym of the ex-code word Y is "0," a threshold "−TH" is set in the comparison circuit 6-m, and when the comparison circuit 6-m receives an input $y_m$ equal to or smaller than "−TH", the correlation matrix W is not updated.

However, when the comparison circuit 6-m receives an input $y_m$ greater than "−TH", the correlation matrix Wm is updated as follows:

$$W_{n,m} = W_{n,m} - Sgn(X_n) \cdot \times \Delta W$$

$$W_{n-1,m} = W_{n-1,m} - Sgn(X_{n-1}) \cdot \times \Delta W$$

$$\vdots$$

$$W_{1,m} = W_{1,m} - Sgn(X_1) \cdot \times \Delta W$$

If each component $[X_n X_{n-1} X_{n-2} \ldots X_2 X_1]$ of the coded word X which has been block-encoded is represented by binary codes of "1" and "0", the computation is carried out with "0" being deemed as "−1." In the above-mentioned equations, Sgn(Xn) denotes a sign of the coded word Xn, that is, plus (+) or minus (−).

The learning rule of the correlation matrix W is repeated a plurality of times for all the coded words X, thereby there is obtained the correlation matrix W in accordance with which an input into the judgment part 3 meets the relation shown in FIG. 3, for all the coded words X.

On the other hand, depending on the threshold "±TH" set in the comparison part 6, even if the learning rule of the correlation matrix W is repeated for all the coded words X, all the coded words X do not always meet the relation shown in FIG. 3. In such a case, the correlation matrix W may be obtained by conducting the learning only by a certain number of times. The correlation matrix W obtained by conducting the learning only by a certain number of times does not satisfy the relation shown in FIG. 3 for all the coded words X. However, since the coded words X are decoded in accordance with the I/O relation shown in FIG. 4, the correct ex-code word Y can be obtained.

Hereinbelow is explained the second embodiment in accordance with the present invention. The decoder 100 and the apparatus 200 in the second embodiment have the same structures as those in the first embodiment. The second embodiment is different from the first embodiment in that a coded word is comprised of symbols like a Reed-Solomon code.

When a coded word is comprised of a Reed-Solomon code which has an encoding ratio (N, M) and in which one symbol is comprised of k bits, 1 bit of the BCH-coded word X in the above-mentioned embodiment is extended to a symbol comprised of k bits, and then, the coded word X is decoded.

That is, replacement is made as follows.

The coded word X comprised of N symbols having N bits is replaced with a coded word comprised of N symbols having (N×k) bits. The correlation matrix W defined by N rows and M columns is replaced with a correlation matrix defined by (N×k) rows and (M×k) columns. The ex-code word Y obtained by decoding, having M bits is replaced with an ex-code word having (M×k) bits (M symbols).

Then, the decoding is carried out in the same manner as the first embodiment to thereby obtain the ex-code word Y.

In a process of learning the correlation matrix W, a Reed-Solomon encoder is used as the encoder 7 illustrated in FIG. 2.

The correlation matrix W may be obtained before carrying out a decoding operation, or otherwise, learning the correlation matrix may be continued while a decoding operation is being conducted.

Figure 6:
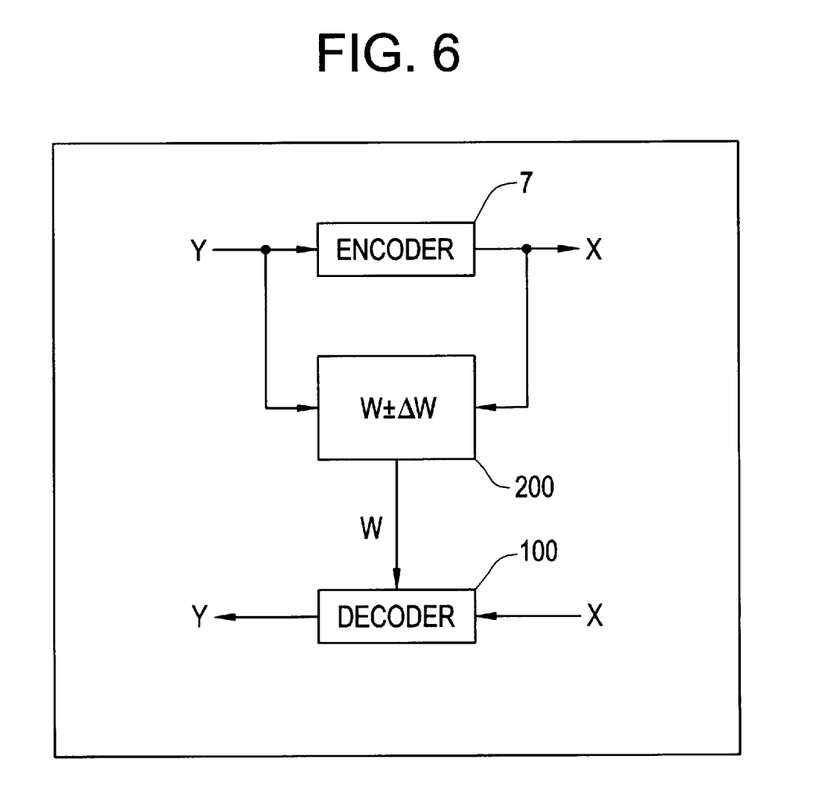
FIG. 6 is a block diagram showing a configuration of an encoder and decoder in accordance with an embodiment of the present invention.

FIG. 6 illustrates a system embodying the latter case. This system simultaneously carries out encoding and decoding.

The system is comprised of an encoder 7, an apparatus 200 for learning a correlation matrix, and a decoder 100. The encoder 7 receives an input Y and transmits an output X. The input Y and the output X are also input into the apparatus 200. The apparatus 200 transmits a correlation matrix W to the decoder 100.

In operation, while the encoder 7 is encoding an ex-code Y into a block code, the apparatus 200 learns the correlation matrix W, and the decoder 100 decodes the coded words X in accordance with the correlation matrix W having been transmitted from the apparatus 200. Accordingly, since the system illustrated in FIG. 6, which simultaneously effects encoding and decoding, always learns the correlation matrix W, even if a polynomial used for encoding is changed during signal transmission, the correlation matrix W becomes optimal. Hence, it is possible to decode the coded words X without modifying a structure of the decoder 100.

As having been described so far, in accordance with the embodiment, matrix computation of the correlation matrix W and the block-encoded word X is carried out through the use of the correlation matrix W defined by the block-encoded words X and the ex-code words Y without carrying out computation of a syndrome and solution of an erroneous position polynomial, and each bit in the computation result "y" is judged whether it is "1" or "0", thereby the ex-code word Y can be obtained. The embodiment provides an advantage that signal delay is minimized.

The embodiment further provides an advantage that since the correlation matrix W is learnt for updating, based on the block-encoded words X and ex-code words Y, the resulting correlation matrix W can correspond to any polynomial for encoding.

An operation of the decoder 100 and the apparatus 200 may be accomplished as a program including various commands, and be presented through a recording medium readable by a computer.

Figure 7:
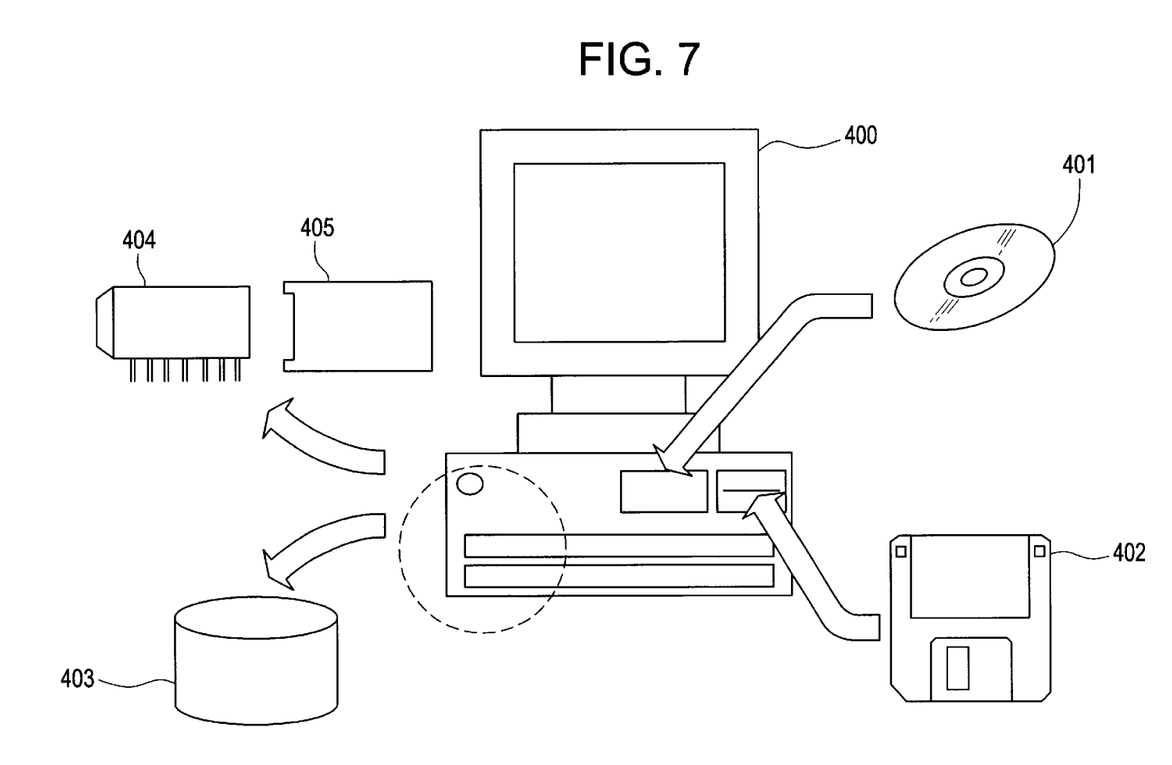
FIG. 7 illustrates examples of recording mediums in which a program for carrying out a method of decoding a block code is to be stored.

In the specification, the term "recording medium" means any medium which can record data therein. Examples of a recording medium are illustrated in FIG. 7.

The term "recording medium" includes, for instance, a disk-shaped recorder 401 such as CD-ROM (Compact Disk-ROM) or PD, a magnetic tape, MO (Magneto Optical Disk), DVD-ROM (Digital Video Disk-Read Only Memory), DVD-RAM (Digital Video Disk-Random Access Memory), a floppy disk 402, a memory chip 404 such as RAM (Random Access Memory) or ROM (Read Only Memory), EPROM (Erasable Programmable Read Only Memory), EEPROM (Electrically Erasable Programmable Read Only Memory), smart media (Registered Trade Mark), a flush memory, a rewritable card-type ROM 405 such as a compact flush card, a hard disk 403, and any other suitable means for storing a program therein.

A recording medium storing a program for accomplishing the above-mentioned apparatus may be accomplished by programming functions of the above-mentioned apparatuses with a programming language readable by a computer, and recording the program in a recording medium such as mentioned above.

A hard disc equipped in a server may be employed as a recording medium. It is also possible to accomplish the recording medium in accordance with the present invention by storing the above-mentioned computer program in such a recording medium as mentioned above, and reading the computer program by other computers through a network.

As a computer 400, there may be used a personal computer, a desk-top type computer, a note-book type computer, a mobile computer, a lap-top type computer, a pocket computer, a server computer, a client computer, a workstation, a host computer, a commercially available computer, and electronic exchanger, for instance.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 2000-172176 filed on Jun. 8, 2000 including specification, claims, drawings and summary is incorporated herein by reference in its entirety.

What is claimed is:

1. A decoder for decoding an encoded word X having N bits as an encoded signal that was encoded by an encoder from an ex-code word Y having M bits as a signal before being encoded by said encoder, wherein N and M are integers with N>M, said decoder comprising:

(a) a correlation matrix computation part which makes computation of said encoded word X with a correlation matrix W defined by N rows and M columns, to output computation result having 1 row and M columns, the computation result thereby having M components;

(b) a judgment part which judges each component in said computation result;

(c) an ex-code word output part which outputs a result of judgment carried out by said judgment part, as a recovered ex-code word corresponding to said ex-code word Y;

(d) a correlation matrix calculation part which makes calculation of said encoded word X with said correlation matrix W to output a calculation result having 1 row and M columns, and thereby M bits; and (e) a comparing and updating device which compares, on a one-to-one basis, said M bits of said calculation result to said M bits of said recovered ex-code word Y, and which updates said correlation matrix W based on a result of comparison.

2. The decoder as set forth in claim 1, wherein said correlation matrix computation part computes a product of said encoded word X and said correlation matrix W.

3. The decoder as set forth in claim 1, wherein said correlation matrix computation part is comprised of:

(a1) a memory which stores said correlation matrix W therein; and (a2) a calculator which calculates a product of said encoded word X and said correlation matrix W.

4. The decoder as set forth in claim 1, wherein said judgment part transmits a signal of "1" if said respective component in said comparison result is positive or zero, and transmits a signal of "0" if said respective component in said comparison result is negative.

5. The decoder as set forth in claim 1, wherein said correlation matrix W is defined such that a respective component of said calculation result is equal to or greater than a predetermined positive threshold if a corresponding component of said recovered ex-code word corresponding to said ex-code word Y is 1, and a respective component of said calculation result is equal to or smaller than a predetermined negative threshold if a corresponding component of said recovered ex-code word corresponding to said ex-code word Y is 0.

6. The decoder as set forth in claim 1, wherein said encoded word X is comprised of symbols.

7. The decoder as set forth in claim 1, wherein said encoded word X is comprised of Reed-Solomon codes.

8. The decoder as set forth in claim 1, wherein said correlation matrix has N×M components, wherein said device updates each component of said correlation matrix W such that a respective component of said calculation result is equal to or greater than a predetermined positive threshold if said ex-code word Y has a respective component of 1, and a respective component of said calculation result is equal to or smaller than a predetermined negative threshold if said ex-code word Y has a respective component of 0.

9. The decoder as set forth in claim 8, wherein said device updates each component of said correlation matrix W by a value ΔW that is smaller than said predetermined positive threshold when either: a) said respective component of said calculation result is less than said predetermined positive threshold when said ex-code word Y has a respective component of 1, or b) said respective component of said calculation result is greater than said predetermined negative threshold when said ex-code word Y has a respective component of 0.

10. The apparatus as set forth in claim 1, wherein said correlation matrix calculation part makes calculation of a plurality of code words X1, X2, . . . , Xp, with said correlation matrix W to output a plurality of calculation results, p being an integer greater than one, wherein said comparing and updating device compares said plurality of calculation results to a plurality of ex-code words Y1, Y2, . . . , Yp, which were encoded by said encoder into said plurality of code words X1, X2, . . . , Xp, and wherein said correlation matrix is sequentially updated based on a result of said comparisons.

11. A method of decoding an encoded word X having N bits as an encoded signal that was encoded by an encoder from an ex-code word Y having M bits as a signal before being encoded by said encoder, wherein N and M are integers with N>M, comprising:

during a decoding mode of operation:

(a) making computation of said encoded word X with a correlation matrix W defined by N rows and M columns, to output a computation result having 1 row and M columns, the computation result thereby having M components;

(b) judging each component in said computation result; and (c) outputting a result of judgment carried out in said step (b), as a recovered ex-code word corresponding to said ex-code word Y;

and, during a learning mode of operation:

(d) making calculation of said encoded word X with said correlation matrix W to output a calculation result having 1 row and M columns, and thereby M bits;

(e) comparing, on a bit-by-bit basis, said M bits of said calculation result to said M bits of said recovered ex-code word Y; and (f) updating said correlation matrix W based on a result of comparison carried out in said step (e).

12. The method as set forth in claim 11, wherein a product of said encoded word X and said correlation matrix W is computed in said step (a).

13. The method as set forth in claim 11, wherein, in said step b), a signal of "1" is transmitted if a respective component of said computation result is positive or zero, and a signal of "0" is transmitted, if a respective component of said computation result is negative.

14. The method as set forth in claim 11, wherein said correlation matrix W is defined such that a respective component of said calculation result is equal to or greater than a predetermined positive threshold if a corresponding component of said recovered ex-code word corresponding to said ex-code word Y is 1, and a respective component of said calculation result is equal to or smaller than a predetermined negative threshold if a corresponding component of said recovered ex-code word corresponding to said ex-code word Y is 0.

15. The method as set forth in claim 11, wherein said correlation matrix has N×M components, wherein said each component of said correlation matrix W is updated in said step (f) such that a respective component of said calculation result is equal to or greater than a predetermined positive threshold if said ex-code word Y has a respective component of 1, and a respective component of said calculation result is equal to or smaller than a predetermined negative threshold if said ex-code word Y has a respective component of 0.

16. The method as set forth in claim 11, wherein each component of said correlation matrix W is updated in said step (f) by a value $\Delta W$ that is smaller than said predetermined positive threshold when either: a) said respective component of said calculation result is less than said predetermined positive threshold when said ex-code word Y has a respective component of 1, or b) said respective component of said calculation result is greater than said predetermined negative threshold when said ex-code word Y has a respective component of 0.

17. A recording medium readable by a computer, storing a program therein for causing a computer to act as a decoder for decoding an encoded word X having N bits as an encoded signal that was encoded by an encoder from an ex-code word Y having M bits as a signal before being encoded by said encoder, wherein N and M are integers with X>Y, said decoder comprising:

(a) a correlation matrix computation part which makes computation of said encoded word X with a correlation matrix W defined by N rows and M columns, to output computation result having 1 row and M columns, the computation result thereby having M components;

(b) a judgment part which judges each component in said computation result;

(c) an ex-code word output part which outputs a result of judgment carried out by said judgment part, as a recovered ex-code word corresponding to said ex-code word Y;

(d) a correlation matrix calculation part which makes calculation of said encoded word X with said correlation matrix W to output a calculation result having 1 row and M columns, and thereby M bits; and (e) a comparing and updating device which compares, on a one-to-one basis, said M bits of said calculation result to said M bits of said recovered ex-code word Y, and which updates said correlation matrix W based on a result of comparison.

18. A recording medium readable by a computer, storing a program therein for causing a computer to carry out a method of decoding an encoded word X having N bits as an encoded signal that was encoded by an encoder from an ex-code word Y having M bits as a signal before being encoded by said encoder, wherein N and M are integers with X>Y, said method comprising:

during a decoding mode of operation:

(a) making computation of said encoded word X with a correlation matrix W defined by N rows and M columns, to output a computation result having 1 row and M columns, the computation result thereby having M components;

(b) judging each component in said computation result; and (c) outputting a result of judgment carried out in said step (b), as a recovered ex-code word corresponding to said ex-code word Y;

and, during a learning mode of operation:

(d) making calculation of said encoded word X with said correlation matrix W to output a calculation result having 1 row and M columns, and thereby M bits;

(e) comparing, on a bit-by-bit basis, said M bits of said calculation result to said M bits of said recovered ex-code word Y; and (f) updating said correlation matrix W based on a result of comparison carried out in said step (e).

* * * * *